United States Patent [19]

Snyder et al.

[11] Patent Number: 5,029,383
[45] Date of Patent: Jul. 9, 1991

[54] ARTICULATING TIP FOR PICK AND PLACE HEAD

[75] Inventors: Michael D.F. Snyder; Erwin Bates, both of Binghamton, N.Y.

[73] Assignee: Universal Instruments Corporation, Binghamton, N.Y.

[21] Appl. No.: 536,277

[22] Filed: Jun. 7, 1990

[51] Int. Cl.⁵ ............................................. H05K 3/30
[52] U.S. Cl. ...................................... 29/740; 29/743; 294/2; 294/64.1
[58] Field of Search ............... 294/64.1, 2; 29/740, 29/743, 741, 759

[56] References Cited
U.S. PATENT DOCUMENTS 4,600,228  7/1986  Tarbuck ............................ 294/64.1
4,728,135  3/1988  Sugimura et al. ................ 29/743 X Primary Examiner—Carl E. Hall
Attorney, Agent, or Firm—Fidelman & Wolffe

[57] ABSTRACT

This pick and place device and method for arranging components on a printed circuit board utilizes a placement head having an articulated, compliant tip for facilitating proper alignment of the component lead plane on the substrate, for example, in a fine pitch component placement machine where extreme accuracy must be achieved in matching the component leads to the circuit land pattern. In general, the articulating tip is fitted within a cavity or opening in the lower end of a spindle. Compressed air may be introduced into the cavity generating an air bearing, thus causing the articulating tip to comply with the upper surface of the component, or else the weight of the tip itself can be used to create the desired compliance. A vacuum force is then created within said opening sufficient to pick-up the component once the compressed air has been turned off. Various configurations of the articulating tip and various methods of air and/or vacuum application are provided.

7 Claims, 3 Drawing Sheets

ARTICULATING TIP FOR PICK AND PLACE HEAD

The present invention is directed to a tip for a pick and place head and, more particularly, to an articulating tip that will conform to the placement plane of a component.

BACKGROUND OF THE INVENTION

Conventional pick and place devices for mounting components on a printed circuit board utilize a simple vacuum probe to pick-up the component and place it at a selected position on the substrate. Such a typical device can be seen, for example, in U.S. Pat. No. 4,611,397, commonly-assigned herewith.

Such conventional pick and place heads rely on machine set-up to ensure alignment of the component lead plane and the placement surface. However, even if the machine can be properly calibrated or set-up, the components and the placement surfaces vary from one to another, making it virtually impossible to provide proper alignment.

SUMMARY OF THE INVENTION

The present invention overcomes the above disadvantages by providing an articulated tip on a pick and place head for use, for example, in a fine pitch component placement machine where extreme accuracy must be achieved in matching the component leads to the circuit land pattern. In general, the articulating tip is fitted within an opening in the lower end of a spindle. Compressed air is introduced into the opening, thus generating an air bearing causing the articulating tip to comply with the upper surface of the component. A vacuum force is then created within said opening sufficient to pick-up the component and lock the tip in its articulated position once the compressed air has been turned off.

In first and second preferred embodiments of the device in accordance with the present invention, the opening is formed as a cavity in the lower portion of the spindle, the cavity being coupled to air and/or vacuum channels. The articulating tip has a corresponding portion that fits within the spindle cavity. Various configurations of the articulating tip/cavity combination are disclosed in the various embodiments.

In the first preferred embodiment, the head is lowered so that the tip complies to the upper surface of the component. In the second embodiment, compressed air flowing through separate compressed air channels causes the upper portion of the tip to act as an air bearing. After compliance, the compressed air is switched off and released.

In each of the first and second preferred embodiments, once the tip has complied with the upper surface of the component, the vacuum is switched on generating a force between the tip and the component, sufficient to pick-up the component and lock the spindle cavity and tip, maintaining proper alignment with respect to the placement plane during further spindle X-, Y- and Z-travel.

Alternatively, in a third preferred embodiment of the device in accordance with the present invention, a spring can be used instead of compressed air to provide the desired minimum placement force applied to the component. Further, the third preferred embodiment includes a further example of an articulating tip and locking cavity configuration.

Alternatively, in a fourth preferred embodiment of the device in accordance with the present invention, the spindle is formed of an inner cylinder and an outer cylinder. The inner cylinder is shorter than the outer cylinder and is movable longitudinally therein. A vacuum tube is fitted concentrically within the outer cylinder with its lower end extending within the inner cylinder. The space formed between the outer cylinder and the vacuum tube is connected to a compressed air port for connection to a compressed air source. A piston is fitted between the vacuum tube, the outer cylinder and the upper edge of the inner cylinder, to prevent leakage of compressed air from the space between the outer cylinder and the vacuum tube into the space between the inner cylinder and the vacuum tube. This piston also acts on the inner cylinder to maintain the tip positionally relative to the other cylinder upon achievement of compliant contact of the tip with the component surface.

Thus, in this preferred embodiment, the articulating tip is merely fitted within the lower opening of an inner cylinder of the spindle. No specially-configured cavity is required. Instead, the articulating tip is supported for articulation at the lower edge of the inner cylinder; at the lower edge of the outer cylinder; and at the flange to achieve the desired "universal joint" type action.

When the compressed air is switched on, the piston moves downwardly, causing the inner cylinder to also move downwardly and act on the articulating tip, thus locking the tip which has complied to the upper surface of the component. Once the vacuum is switched on, a force is generated between the tip and the component sufficient to pick-up the component, while the compressed air locks the spindle and the tip thus maintaining proper alignment with respect to the placement plane during further spindle X-, Y- and Z-travel.

The force applied by the spindle in all preferred embodiments provides the desired force that can be applied to the component without overstressing the leads. The tip complies to the upper surface of the component, even if the upper surface of the component is tilted in relationship to the component lead plane.

BRIEF DESCRIPTION OF THE DRAWINGS

The above aspects of the present invention can be seen from the attached drawings, in which.

DETAILED DESCRIPTION OF THE PREFERRED EMBODIMENTS

Figure 1:
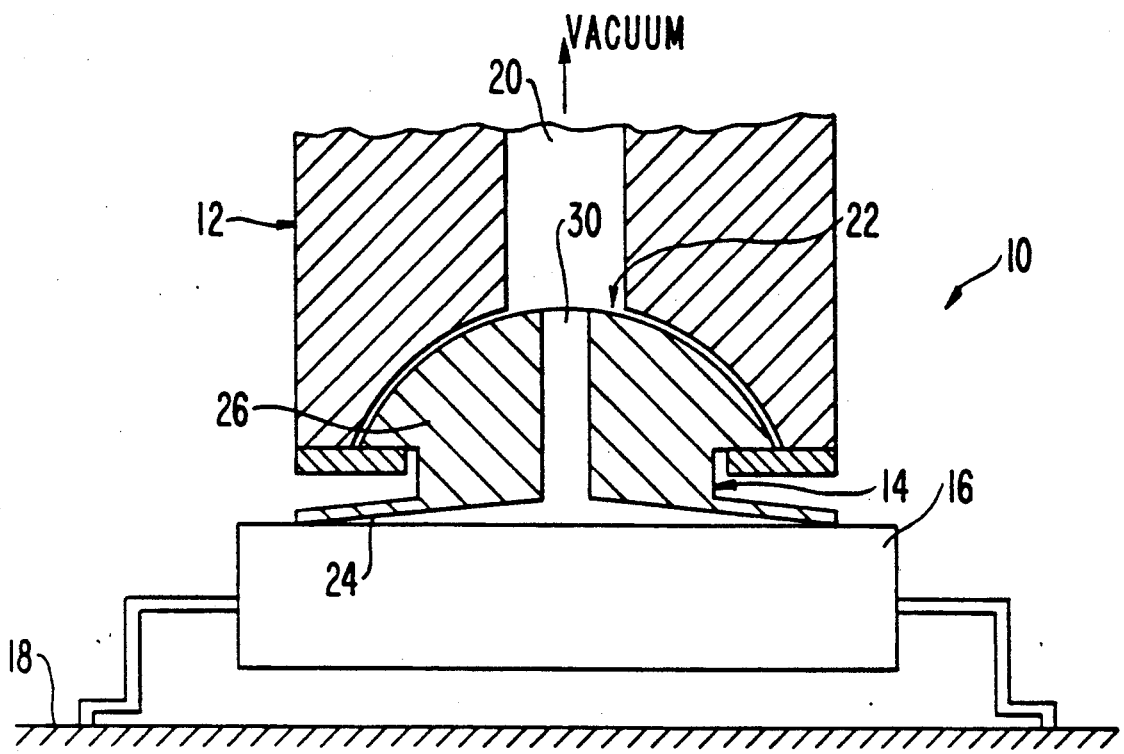
FIG. 1 is a partial cross-sectional view illustrating a pick and place head having an articulated tip, as in a first preferred embodiment of the present invention.

A pick and place head having an articulated tip, in accordance with a first preferred embodiment of the present invention, is illustrated in FIG. 1. Throughout the drawings, like numerals will represent like elements.

Pick and place head 10 includes spindle 12 coupled to articulated tip 14. The spindle is movable in the X-, Y- and Z-planes in a conventional manner. Component 16 and its lead plane are disposed on surface 18, parallel to the placement plane.

Spindle 12 includes central vacuum channel 20, the channel preferably being co-axial with the spindle. The spindle 12 also includes, at the lower end thereof, a cavity 22, with the vacuum channel 20 coupled to the cavity 22. In the first preferred embodiment, cavity 22 is preferably hemispherically shaped. This cavity receives the articulated tip 14 therein, as will be described in more detail below.

Articulated tip 14 includes a pick-up portion 24 coupled to an upper portion 26. In the first preferred embodiment, the upper portion 26 is preferably hemispherically shaped and is fitted within hemi-spherical cavity 22 of spindle 12 to form a sort of "universal joint". Of course, the cavity and the upper portion of the tip can be formed of any suitable shape, so long as the tip is movable and rotatable within the cavity. Vacuum port 30 connects the cavity with the lower surface of pick-up portion 24.

In operation, a component is placed on surface 18 parallel to a placement plane. The placement head spindle lowers for component pick-up, and the weight of the tip itself provides the desired force (minimum placement force) that can be applied without overstressing the leads. The downward spindle movement is stopped once the tip fully articulates and complies to the upper surface of the component with a desired force. At this time, the vacuum is switched on, generating a vacuum force between the inner walls of the spindle cavity and the upper portion of the tip and between the pick-up portion of the tip and the upper surface of the component. This creates the desired connection between the spindle, the tip and the component, while maintaining proper alignment with the placement plane. The placement head is then drawn upwardly and moved into its placement position over the printed circuit board.

Figure 2:
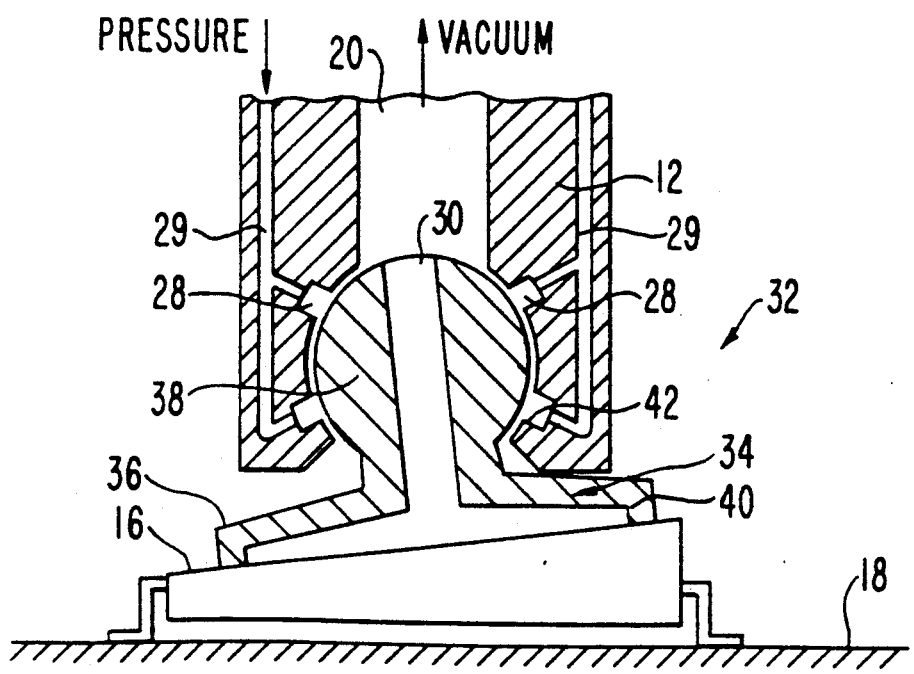
FIG. 2 is a partial cross-sectional view illustrating a pick and place head having an articulated tip, as in a second preferred embodiment of the present invention.
Figure 3:
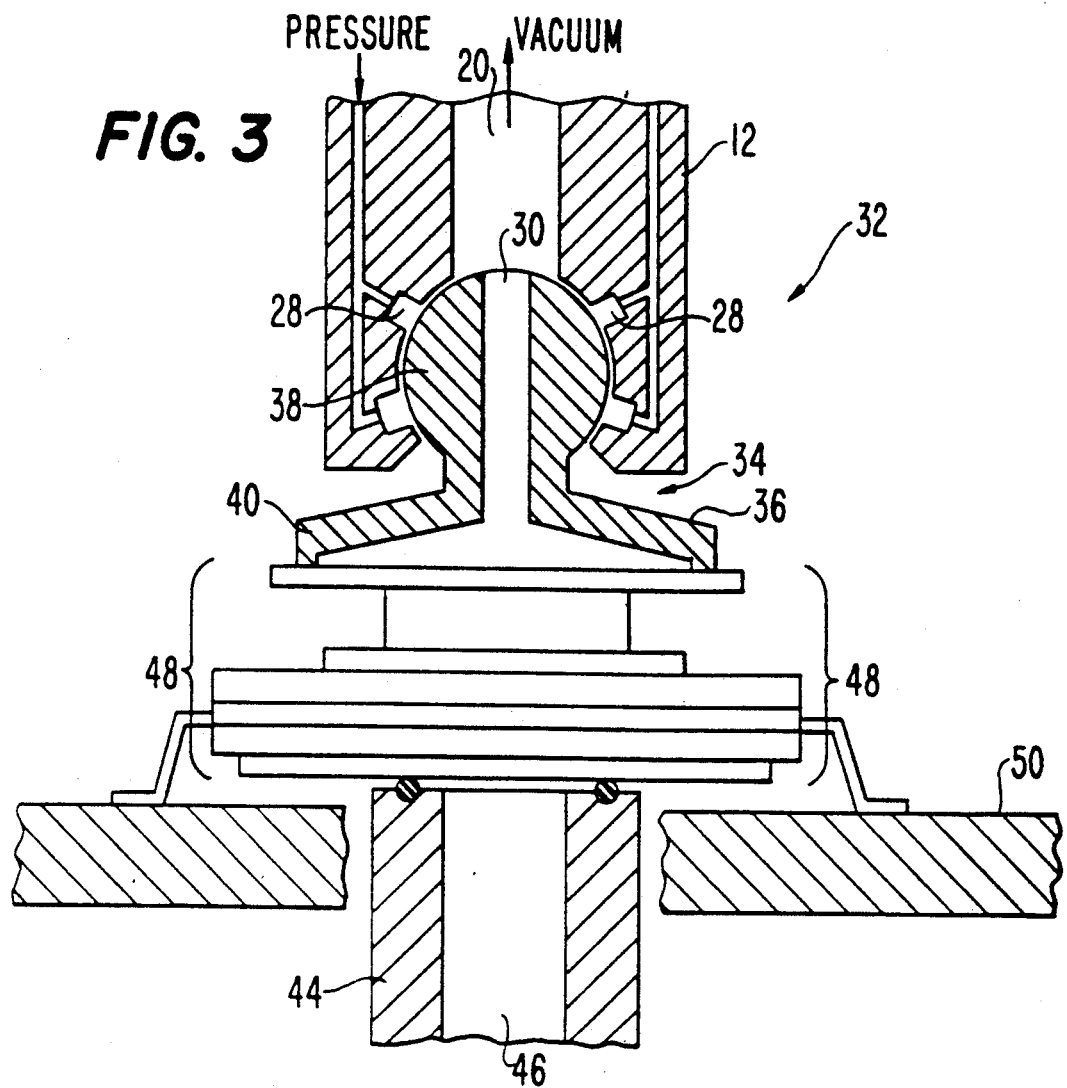
FIG. 3 is a partial cross-sectional view of the articulated tip shown in FIG. 2, with the component riding on a vacuum post.

A second preferred embodiment of the present invention is illustrated in FIGS. 2 and 3, which show a pick and place head 32 having a modified tip construction. In this second preferred embodiment, the articulated tip 34 includes modified pick-up portion 36 and modified upper portion 38. Modified upper portion 38 is preferably substantially spherically-shaped and the modified pick-up portion has downwardly extending flanges 40. Modified cavity 42 is spherically-shaped to conform with spherically-shaped upper portion 38. Grooves 28 may be formed in spindle 12 to facilitate air flow therein.

In this second preferred embodiment, spindle 12 also includes compressed air channels 29. These channels 29 connect grooves 28, and hence cavity 42, with a compressed air source (not shown). In this second, preferred embodiment, the placement head spindle lowers for component pick-up, while compressed air is flowing through compressed air conduits 29, grooves 28 and cavity 42. This air flow causes tip 34 to act as an air bearing, first between tip 34 and the upper surface of the component, and later between the surface of upper portion 38 and cavity 42. This provides substantially frictionless articulation between the tip and the upper surface of the component. Then the compressed air is switched off, and the vacuum is switched on, and the operation proceeds as in the first preferred embodiment.

FIG. 2 illustrates the articulation of tip 34 for a component having a slanted upper surface.

The articulating tip of any of the preferred embodiments can be used in conjunction with a vacuum post mechanism as shown in FIG. 3. Vacuum post 44 having vacuum port 46 secures component 48, illustrated as a multi-layer component, against surface 50 in its proper planar position. Vacuum post 44 preferably has angular compliance in the Z-direction, i.e., vertically. Alternatively, a second articulating tip (not shown) can be used in place of a vacuum post to hold the component in position.

Figure 4:
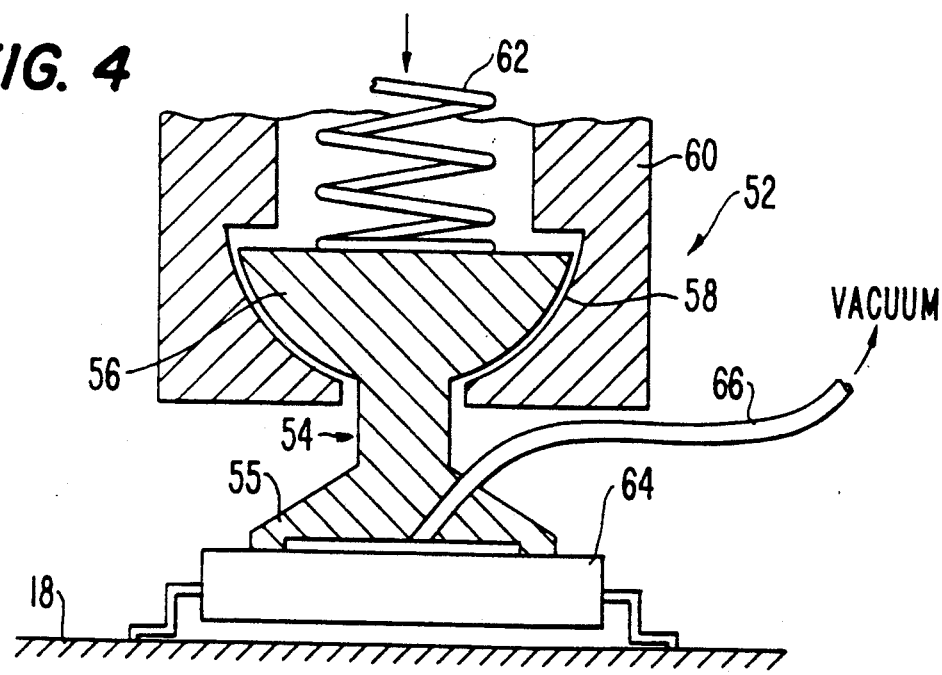
FIG. 4 is a partial cross-sectional view illustrating a pick and place head having an articulated tip as in a third preferred embodiment of the present invention.

A third preferred embodiment of the present invention is illustrated in FIG. 4, which shows a pick and place head 52 having a further modified tip construction 54. This embodiment preferably utilizes a lower portion 55 and an inverted hemi-spherical upper portion 56 and correspondingly-shaped spindle cavity 58 formed in spindle 60. In contrast to the previously described embodiment, the third preferred embodiment uses spring 62 and the weight of the tip itself to provide the desired force (minimum placement force) that can be applied to the component without overstressing the leads.

Retraction of spring 62, and hence upper portion 56, allows the tip 54 to articulate to conform to the top surface of component 64. As the spindle 60 is raised, the spring 62 pushes the inverted hemi-spherical upper portion 56 in contact with spindle cavity 58 and maintains the articulated position of the tip as the component is moved to the substrate for placement.

In operation, the tip in accordance with the third preferred embodiment is lowered, with or without a compressed air bearing, so that the tip overtravels slightly upon contacting a component upper surface. Vacuum source (not shown) is then directed through the channel 66 to provide suction to the top of the component. The spindle 60 then raises, causing the upper portion 56 of the articulated tip 54 to seat within the cavity, achieving compliance as discussed above.

Figure 5:
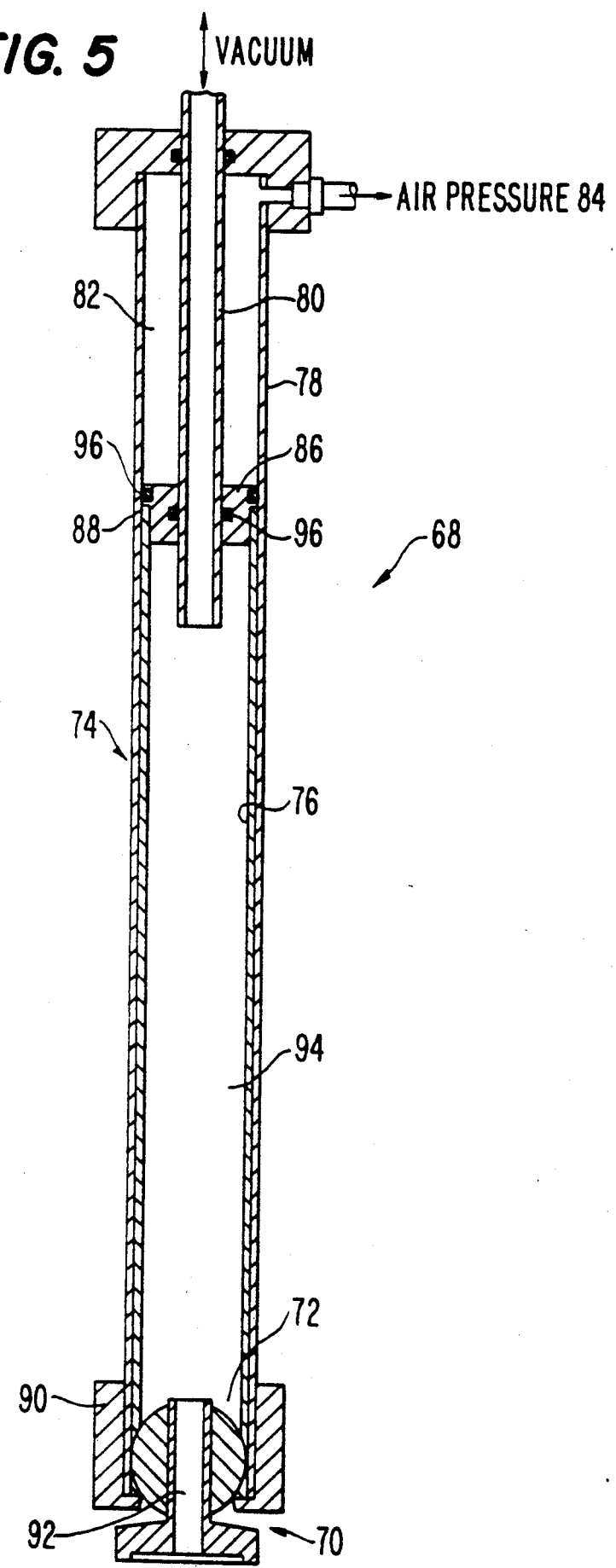
FIG. 5 is a partial cross-sectional view illustrating a pick and place head having an articulated tip as in a fourth preferred embodiment of the present invention.

A fourth preferred embodiment of the present invention is illustrated in FIG. 5, which shows a pick and place head 68 having a further modified tip construction 70. In the fourth preferred embodiment, the articulating tip 70 is fitted within the lower opening 72 of the spindle 74, in a manner discussed in more detail below. Thus, the lower opening of the spindle itself forms the cavity; no specially-configured cavity is required.

The spindle 74 is preferably formed of an inner cylinder 76 and an outer cylinder 78, the inner cylinder 76 being shorter than the outer cylinder 78 and movable longitudinally within the outer cylinder. A vacuum tube 80 is fitted concentrically within the outer cylinder 78 with its lower end extending within the inner cylinder 76. The space 82 formed between the outer cylinder 78 and the vacuum tube 80 is connected to a compressed air port 84 for connection to a compressed air source (not shown). A piston 86, fitted between the vacuum tube 80, the outer cylinder 78 and the upper edge 88 of the inner cylinder 76, prevents leakage of compressed air from space 82. This piston also acts on inner cylinder 76 to facilitate compliance of the tip with the component surface, as will be explained below.

A flange 90, provided at the lower end of the outer cylinder 78, supports the underside of the articulating tip 70. The tip 70 includes a central vacuum bore 92 therein. This bore connects the lower surface of articulating tip 70 with a space 94 formed within the cylinders below the piston 86. This space 94 is connected to the interior of vacuum tube 80 and hence to a vacuum source (not shown). Thus, the articulating tip 70 is preferably supported for articulation at the lower edge of the inner cylinder; at the lower edge of the outer cylinder; and at the flange to achieve the desired "universal joint" type action.

When the compressed air is switched on, piston 86 is forced downwardly against inner cylinder 76, thus causing the inner cylinder to slide downwardly within the outer cylinder 78 to maintain compliance of the tip with the upper surface of the component (not shown), hence maintaining proper alignment with respect to the placement plane during further spindle X-, Y- and Z- travel. The vacuum is switched on to generate a force between the tip and the component sufficient to pick-up the component.

O-ring seals 96, or any other suitable seals, may be used to seal inner cylinder 76 and outer cylinder 78 to piston 86.

The foregoing is for illustrative purposes only. Modification can be made, particularly with regard to matters of size, shape and arrangement of parts, within the scope of the invention as defined by the appended claims.

I claim:

1. A pick and place device for picking up an electrical component from a surface parallel to a placement plane and placing the component as desired on a substrate, said device comprising:
   a movable placement head spindle;
   an articulating tip coupled for articulation to a lower end of said movable placement head spindle;
   an air/vacuum means coupled to said lower end of said spindle for selectively either introducing compressed air to said tip or generating a vacuum force through said tip so that, when the compressed air is flowing, substantially frictionless articulation is provided to the upper surface of the component and tip and spindle, said articulation being maintained in a particular orientation when the compressed air is switched off and the vacuum force is generated to pick-up the component, thus maintaining proper alignment of a component lead plane for placement on the substrate;
   said spindle comprising inner and outer cylinders, said inner cylinder being movable longitudinally within said outer cylinder; and said articulating tip being directly in contact with at least one of said cylinders and selectively contactable with the other of said cylinders; and
   a piston movably disposed within said outer cylinder at an upper edge of said inner cylinder.

2. A device as in claim 1, wherein said tip includes a substantially spherically shaped upper portion fitted within a complementary cavity of said spindle.

3. A device as in claim 1, further comprising a vacuum post means for applying a vacuum force to said component and maintaining the component lead plane parallel to the placement plane prior to pick-up of said component.

4. A device as in claim 1, wherein said vacuum means includes a vacuum tube coupled to a space formed between said inner cylinder and articulating tip, and wherein said means for introducing compressed air includes a compressed air port coupled to a space formed between said outer cylinder and said piston, so that when said compressed air is applied to said space, said piston moves downwardly, causing said inner cylinder to also move downwardly until the tip is contacted sufficiently to maintain said particular orientation between said tip and spindle after the desired articulation is achieved.

5. A pick and place device for picking up a component from a surface which is parallel to the plane of a placement site of a substrate and placing said component onto said placement site while maintaining a particular orientation of said component relative to a spindle of said device from pick-up of said component to placement of said component, said device comprising:
   a tip articulatingly attached to an end of said spindle in order that a work engaging portion of said tip complies to a surface of said component in preparation for said pick-up and after said placement, said tip having means for applying vacuum to said component selectively in order to hold said component thereon for said picking and placing;
   means for floating said tip relative to said spindle during articulating of said tip and complying of said work engaging portion thereof to said component;
   means for maintaining a particular orientation of said tip relative to said spindle upon having attained said complying and until said placing is completed;
   said tip floating means and tip orientation maintaining means comprising a compression spring acting between said tip and said spindle so as to maintain said particular orientation between said tip and said spindle whenever a threshold reactive force through said tip does not compress said spring sufficiently to allow said articulating.

6. A pick and place device for picking up a component from a surface which is parallel to the plane of a placement site of a substrate and placing said component onto said placement site while maintaining a particular orientation of said component relative to a spindle of said device from pick-up of said component to placement of said component, said device comprising:
   a tip articulatingly attached to an end of said spindle in order that a work engaging portion of said tip complies to a surface of said component in preparation for said pick-up and after said placement, said tip having means for applying vacuum to said component selectively in order to hold said component thereon for said picking and placing, said tip being reorientable relative to said spindle during articulating of said tip and complying of said work engaging portion thereof to said component;
   a generally spherically shaped cavity at said spindle end and a generally spherically shaped portion of said tip fitted within said cavity with sufficient looseness to allow an air bearing therebetween, said cavity having channels in an inner periphery thereof which are suppliable with positive pressure, wherein said channels are distinct from a vacuum bore of said spindle; and
   means for maintaining a particular orientation of said tip relative to said spindle upon having attained said complying and until said placing is completed.

7. A pick and place device for picking up a component from a surface which is parallel to the plane of a placement site of a substrate and placing said component onto said placement site while maintaining a particular orientation of said component relative to a spindle of said device from pick-up of said component to placement of said component, said device comprising:

a tip articulating attached to an end of said spindle in order that a work engaging portion of said tip complies to a surface of said component in preparation for said pick-up and after said placement, said tip having means for applying vacuum to said component selectively in order to hold said component thereon for said picking and placing;

means for maintaining a particular orientation of said tip relative to said spindle upon attaining compliance of said tip to said component surface and until said placing is completed, and comprising a tube telescopically attached to said spindle and selectively extensible into engagement with said tip so as to prevent articulation thereof.

* * * * *